United States Patent
Shi et al.

(10) Patent No.: US 10,109,251 B2
(45) Date of Patent: Oct. 23, 2018

(54) GATE DRIVER ON ARRAY (GOA) CIRCUIT OF IGZO THIN FILM TRANSISTOR AND DISPLAY DEVICE THEREOF

(71) Applicant: SHENZHEN CHINA STAR OPTOELECTRONICS TECHNOLOGY CO., LTD., Guangdong (CN)

(72) Inventors: Longqiang Shi, Guangdong (CN); Shujhih Chen, Guangdong (CN)

(73) Assignee: SHENZHEN CHINA STAR OPTOELECTRONICS TECHNOLOGY CO., LTD., Guangdong (CN)

(*) Notice: Subject to any disclaimer, the term of this patent is extended or adjusted under 35 U.S.C. 154(b) by 3 days.

(21) Appl. No.: 15/329,251

(22) PCT Filed: Jan. 13, 2017

(86) PCT No.: PCT/CN2017/071156
§ 371 (c)(1),
(2) Date: Jan. 26, 2017

(87) PCT Pub. No.: WO2018/120303
PCT Pub. Date: Jul. 5, 2018

(65) Prior Publication Data
US 2018/0190231 A1    Jul. 5, 2018

(30) Foreign Application Priority Data
Dec. 30, 2016  (CN) .......................... 2016 1 1262910

(51) Int. Cl.
*G09G 3/36* (2006.01)
*H01L 27/12* (2006.01)
*H01L 29/786* (2006.01)

(52) U.S. Cl.
CPC ......... *G09G 3/3677* (2013.01); *G09G 3/3655* (2013.01); *G09G 3/3696* (2013.01);
(Continued)

(58) Field of Classification Search
CPC .. G09G 3/3677; G09G 3/3655; G09G 3/3696; G09G 2300/0408;
(Continued)

(56) References Cited

U.S. PATENT DOCUMENTS 9,472,155 B2 * 10/2016 Xiao .................... G09G 3/3677
2015/0171833 A1    6/2015 Pi et al.
(Continued)

FOREIGN PATENT DOCUMENTS

| CN | 104157260 A | 11/2014 |
| CN | 106057157 A | 10/2016 |
| CN | 106228942 A | 12/2016 |

*Primary Examiner* — Mark Regn
(74) *Attorney, Agent, or Firm* — Mark M. Friedman

(57) ABSTRACT

A gate driver on array (GOA) circuit of an IGZO thin film transistor and a display device thereof are described. The GOA circuit of the IGZO TFT includes a plurality of cascade GOA units. The GOA unit in the stage N includes a pull-up control unit, a pull-up unit, a pull-down unit, a pull-down holding unit, a transferring unit, a bootstrap capacitor, a first constant voltage with a negative level electrical potential, and a second constant voltage with a negative level electrical potential. The present invention solves the problem of the failure of the GOA circuit in the IGZO TFT.

16 Claims, 3 Drawing Sheets

(52) U.S. Cl.
CPC .... *H01L 27/1214* (2013.01); *H01L 29/78603* (2013.01); *G09G 2300/043* (2013.01); *G09G 2300/0408* (2013.01); *G09G 2300/0809* (2013.01); *G09G 2310/0264* (2013.01)

(58) Field of Classification Search
CPC ..... G09G 2300/043; G09G 2300/0809; G09G 2310/0264; H01L 27/1214; H01L 29/7803
USPC .......................................................... 345/92
See application file for complete search history.

(56) References Cited

U.S. PATENT DOCUMENTS

| | | | |
|---|---|---|---|
| 2016/0064098 A1* | 3/2016 | Han | G11C 19/28 345/211 |
| 2016/0247476 A1 | 8/2016 | Xiao | |

* cited by examiner

GATE DRIVER ON ARRAY (GOA) CIRCUIT OF IGZO THIN FILM TRANSISTOR AND DISPLAY DEVICE THEREOF

BACKGROUND OF THE INVENTION

Field of Invention

The present invention relates to a technical field of a liquid crystal display, and more particularly to a gate driver on array (GOA) circuit of an IGZO thin film transistor and a display device thereof.

Description of Prior Art

Currently, a display panel with a gate driver on array (GOA) formed on an array substrate is adopted, where a GOA circuit is a scan line driver directly formed on an array substrate. The GOA circuit includes a plurality of shift registers which are arranged by multiple sequentially connected stages, where each of the shift registers drives a scan line and provides an activation signal to a next shift register to allow the GOA circuit to turn on the scan lines using line by line. In comparison to a conventional technique, the GOA circuit can saves the manufacturing cost and a binding process along an arrangement direction of the gate electrodes to increase the production capacity and integration of the LCD panel.

The GOA circuit usually includes a pull-up part, a pull-up control part, a transfer part, a pull-down part, a pull-down holding part, and a boost part for boosting a potential level, where the boost part includes a bootstrap capacitor. The pull-up part is configured to output an input clock signal to a gate of a thin film transistor (TFT) to serve as a driving signal of the LCD. The pull-up control part is configured to turn on the pull-up part, where a control signal of the pull-up control part is from a GOA circuit in a previous stage. The pull-down part is configured to output a scan signal and then pulls down the level of the scan signal (e.g., a gate potential of the TFT). The pull-down holding part is configured to maintain the scan signal and the signal of the pull-up part an off status (e.g., a predetermined negative level). The boost part is configured to secondly boost the level of the pull-up part to ensure a normal output of the pull-up part. The IGZO material has a higher mobility rate and better device stability. Due to above-mentioned properties, the complexity of the GOA circuit is reduced. Due to the mobility rate, the TFT size can be decreased in comparison to a-Si for facilitating the manufacturing procedure of the display with a narrow bezel. The device stability can reduce the number of power units and TFT for stabling the performance of TFT to simplify the electrical circuit and reduce the power consumption. However, a threshold voltage of IGZO-TFT may easily drop off a negative value, resulting in the failure of the GOA circuit. Additionally, the IGZO-TFT is sensitive to the positive bias temperature stress (PBTS) of direct current (DC). The stress of loner duration will lead to a severe positive migration of the threshold voltage of the IGZO-TFT and thus results in the failure of the GOA circuit.

SUMMARY OF THE INVENTION

Therefore, one objective of the present invention is to provide a gate driver on array (GOA) circuit of an IGZO thin film transistor and a display device thereof to solve the problem of the failure of the GOA circuit in the negative status of the threshold voltage of IGZO TFT.

Based on the above objective, the present invention sets forth the following technical solutions.

A gate driver on array (GOA) circuit of an indium gallium zinc oxide (IGZO) in a thin film transistor (TFT) including a plurality of cascade GOA units wherein n is a positive integer, the GOA unit in the stage N including a pull-up control unit configured to control a scan driving signal of a scan line in a current stage to maintain a high level; a pull-up unit configured to pull up the scan driving signal of the scan line in the current stage; a pull-down unit configured to pull down the scan driving signal of the scan line in the current stage; a pull-down holding unit configured to generate a scan driving signal having a low electrical level of the scan line in the current stage; a transferring unit configured to output a stage-transmitting signal in the current stage; a bootstrap capacitor configured to generate a scan driving signal having either a low or a high electrical level of the scan line in the current stage; a first constant voltage with a negative level electrical potential configured to provide a first constant voltage signal with the negative level electrical potential, which is a negative direct current (DC) power; and a second constant voltage with a negative level electrical potential configured to provide a second constant voltage signal with the negative level electrical potential, which is a negative direct current (DC) power; wherein the first constant voltage with the negative level electrical potential is coupled to the pull-down holding unit and the pull-down unit, and the second constant voltage with the negative level electrical potential is coupled to the pull-down holding unit.

In one embodiment, an electrical potential level outputted by the second constant voltage with the negative level electrical potential is less than an electrical potential level outputted by the first constant voltage with the negative level electrical potential.

In one embodiment, electrical potential levels outputted by the second constant voltage with the negative level electrical potential and the first constant voltage with the negative level electrical potential are less than a voltage threshold of the IGZO in the TFT.

In one embodiment, the pull-up control unit includes a first TFT, a second TFT, and a third TFT; wherein a source electrode of the first TFT is coupled to either an input terminal ST(n−4) of a stage-transmitting signal in the stage (n−4) or an input terminal STV of a starting signal, the drain electrode of the first TFT is coupled to the source electrodes of the second TFT and the third TFT, and a gate electrode of the first TFT is coupled to a gate electrode of the third TFT; wherein a drain electrode of the second TFT is coupled to an output terminal of the scan driving signal in the current stage, and a gate electrode of the second TFT is coupled to a first node; wherein a drain electrode of the third TFT is coupled to the first node, a gate electrode of the third TFT is coupled to either the input terminal ST(n−4) of a stage-transmitting signal in the stage (n−4) or the input terminal of the starting signal.

In one embodiment, the transferring unit includes a fourth TFT, a clock signal in the current stage is inputted to a source electrode of the fourth TFT, a drain electrode of the fourth TFT is coupled to an output terminal of a stage-transmitting signal in the current stage, and a gate electrode of the fourth TFT is coupled to the first node.

In one embodiment, the pull-up unit includes a fifth TFT, a clock signal in the current stage is inputted to a source electrode of the fifth TFT, a drain electrode of the fifth TFT is coupled to an output terminal of a scan driving signal in the current stage, and a gate electrode of the fifth TFT is coupled to the first node.

In one embodiment, the pull-down unit includes a sixth TFT, a seventh TFT, an eighth TFT, a ninth TFT, a tenth TFT, and an eleventh TFT; wherein a gate electrode of the sixth TFT is coupled to the first node, a drain electrode of the sixth TFT is coupled to an output terminal of a scan driving signal in the current stage, and a source electrode of the sixth TFT is coupled to a source electrode of the seventh TFT and a drain electrode of the eighth TFT; wherein a drain electrode of the seventh TFT is coupled to the output terminal of a scan driving signal in the current stage, a source electrode of the seventh TFT is coupled to a drain electrode of the eighth TFT, and a gate electrode of the seventh TFT is coupled to a gate electrode of the eighth TFT; wherein a source electrode of the eighth TFT is coupled to the first constant voltage with the negative level electrical potential, a gate electrode of the eighth TFT is coupled to an output terminal of a scan driving signal in the stage (n+4); wherein a drain electrode of the ninth TFT is coupled to the first node, where a source electrode of the ninth TFT is coupled to a drain electrode of the tenth TFT, and a gate electrode of the ninth TFT is coupled to the gate electrode of third TFT; wherein a gate electrode of the tenth TFT is coupled to the output terminal of the scan driving signal in the stage (n+4), where a source electrode of the tenth TFT is coupled to the first constant voltage with a negative level electrical potential; wherein a gate electrode of the eleventh TFT is coupled to the first node, a drain electrode of the eleventh TFT is coupled to an output terminal of a scan driving signal in the current stage, and a source electrode of the eleventh TFT is coupled to the drain electrode of the tenth TFT.

In one embodiment, the pull-down holding unit includes a twelfth TFT, a thirteenth TFT, a fourteenth TFT, a fifteenth TFT, a sixteenth TFT, a seventeenth TFT, and an eighteenth TFT; wherein a source electrode of the twelfth TFT is coupled to the first constant voltage with the negative level electrical potential, a drain electrode of the twelfth TFT is coupled to an output terminal of a stage-transmitting signal in the current stage, and a gate electrode of the twelfth TFT is coupled to the second node; wherein a source electrode of the thirteenth TFT is coupled to the first constant voltage with the negative level electrical potential, a drain electrode of the thirteenth TFT is coupled to an output terminal of a stage-transmitting signal in the current stage, and a gate electrode of the twelfth TFT is coupled to the second node; wherein a source electrode of the fourteenth TFT is coupled to the second node, a drain electrode of the fourteenth TFT is coupled to either an input terminal of a constant voltage with a high electrical level or an input terminal of a clock signal in the current stage, and a gate electrode of the fourteenth TFT is coupled to a source electrode of the seventeenth TFT and a drain electrode of the sixteenth TFT; wherein a drain electrode of the fifteenth TFT is coupled to the second node, a source electrode of the fifteenth TFT is coupled to the second constant voltage with the negative level electrical potential, and the gate electrode of the fifteenth TFT is coupled to the first node; wherein a source electrode of the sixteenth TFT is coupled to the second constant voltage with the negative level electrical potential, where a drain electrode of the sixteenth TFT is coupled to a source electrode of the seventeenth TFT, and a gate electrode of the sixteenth TFT is coupled to the first node; wherein a drain electrode of the seventeenth TFT is coupled to the drain electrode of the fourteenth TFT, where a gate electrode of the seventeenth TFT is coupled to either an input terminal of a constant voltage with a high electrical level or an input terminal of a clock signal in the current stage; wherein a gate electrode of the eighteenth TFT is coupled to the second node, a source electrode of the eighteenth TFT is coupled to the first constant voltage with the negative level electrical potential, and the drain electrode of the eighteenth TFT is coupled to the first node.

In one embodiment, one terminal of the bootstrap capacitor is coupled to the first node and the other terminal of the bootstrap capacitor is coupled to the output terminal of the scan driving signal in the current stage.

A display device including a gate driver on array (GOA) circuit of an indium gallium zinc oxide (IGZO) in a thin film transistor (TFT), the GOA circuit including a plurality of cascade GOA units wherein n is a positive integer, the GOA unit in the stage N including a pull-up control unit configured to control a scan driving signal of a scan line in a current stage to maintain a high level; a pull-up unit configured to pull up the scan driving signal of the scan line in the current stage; a pull-down unit configured to pull down the scan driving signal of the scan line in the current stage; a pull-down holding unit configured to generate a scan driving signal having a low electrical level of the scan line in the current stage; a transferring unit configured to output a stage-transmitting signal in the current stage; a bootstrap capacitor configured to generate a scan driving signal having either a low or a high electrical level of the scan line in the current stage; a first constant voltage with a negative level electrical potential configured to provide a first constant voltage signal with the negative level electrical potential, which is a negative direct current (DC) power; and a second constant voltage with a negative level electrical potential configured to provide a second constant voltage signal with the negative level electrical potential, which is a negative direct current (DC) power; wherein the first constant voltage with the negative level electrical potential is coupled to the pull-down holding unit and the pull-down unit, and the second constant voltage with the negative level electrical potential is coupled to the pull-down holding unit.

In one embodiment, an electrical potential level outputted by the second constant voltage with the negative level electrical potential is less than an electrical potential level outputted by the first constant voltage with the negative level electrical potential.

In one embodiment, electrical potential levels outputted by the second constant voltage with the negative level electrical potential and the first constant voltage with the negative level electrical potential are less than a voltage threshold of the IGZO in the TFT.

In one embodiment, the pull-up control unit includes a first TFT, a second TFT, and a third TFT; wherein a source electrode of the first TFT is coupled to either an input terminal ST(n−4) of a stage-transmitting signal in the stage (n−4) or an input terminal STV of a starting signal, the drain electrode of the first TFT is coupled to the source electrodes of the second TFT and the third TFT, and a gate electrode of the first TFT is coupled to a gate electrode of the third TFT; wherein a drain electrode of the second TFT is coupled to an output terminal of the scan driving signal in the current stage, and a gate electrode of the second TFT is coupled to a first node; wherein a drain electrode of the third TFT is coupled to the first node, a gate electrode of the third TFT is coupled to either the input terminal ST(n−4) of a stage-transmitting signal in the stage (n−4) or the input terminal of the starting signal.

In one embodiment, the transferring unit includes a fourth TFT, a clock signal in the current stage is inputted to a source electrode of the fourth TFT, a drain electrode of the fourth TFT is coupled to an output terminal of a stage-transmitting signal in the current stage, and a gate electrode of the fourth TFT is coupled to the first node.

In one embodiment, the pull-up unit includes a fifth TFT, a clock signal in the current stage is inputted to a source electrode of the fifth TFT, a drain electrode of the fifth TFT is coupled to an output terminal of a scan driving signal in the current stage, and a gate electrode of the fifth TFT is coupled to the first node.

In one embodiment, the pull-down unit includes a sixth TFT, a seventh TFT, an eighth TFT, a ninth TFT, a tenth TFT, and an eleventh TFT; wherein a gate electrode of the sixth TFT is coupled to the first node, a drain electrode of the sixth TFT is coupled to an output terminal of a scan driving signal in the current stage, and a source electrode of the sixth TFT is coupled to a source electrode of the seventh TFT and a drain electrode of the eighth TFT; wherein a drain electrode of the seventh TFT is coupled to the output terminal of a scan driving signal in the current stage, a source electrode of the seventh TFT is coupled to a drain electrode of the eighth TFT, and a gate electrode of the seventh TFT is coupled to a gate electrode of the eighth TFT; wherein a source electrode of the eighth TFT is coupled to the first constant voltage with the negative level electrical potential, a gate electrode of the eighth TFT is coupled to an output terminal of a scan driving signal in the stage (n+4); wherein a drain electrode of the ninth TFT is coupled to the first node, where a source electrode of the ninth TFT is coupled to a drain electrode of the tenth TFT, and a gate electrode of the ninth TFT is coupled to the gate electrode of third TFT; wherein a gate electrode of the tenth TFT is coupled to the output terminal of the scan driving signal in the stage (n+4), where a source electrode of the tenth TFT is coupled to the first constant voltage with a negative level electrical potential; wherein a gate electrode of the eleventh TFT is coupled to the first node, a drain electrode of the eleventh TFT is coupled to an output terminal of a scan driving signal in the current stage, and a source electrode of the eleventh TFT is coupled to the drain electrode of the tenth TFT.

In one embodiment, the pull-down holding unit includes a twelfth TFT, a thirteenth TFT, a fourteenth TFT, a fifteenth TFT, a sixteenth TFT, a seventeenth TFT, and an eighteenth TFT; wherein a source electrode of the twelfth TFT is coupled to the first constant voltage with the negative level electrical potential, a drain electrode of the twelfth TFT is coupled to an output terminal of a stage-transmitting signal in the current stage, and a gate electrode of the twelfth TFT is coupled to the second node; wherein a source electrode of the thirteenth TFT is coupled to the first constant voltage with the negative level electrical potential, a drain electrode of the thirteenth TFT is coupled to an output terminal of a stage-transmitting signal in the current stage, and a gate electrode of the twelfth TFT is coupled to the second node; wherein a source electrode of the fourteenth TFT is coupled to the second node, a drain electrode of the fourteenth TFT is coupled to either an input terminal of a constant voltage with a high electrical level or an input terminal of a clock signal in the current stage, and a gate electrode of the fourteenth TFT is coupled to a source electrode of the seventeenth TFT and a drain electrode of the sixteenth TFT; wherein a drain electrode of the fifteenth TFT is coupled to the second node, a source electrode of the fifteenth TFT is coupled to the second constant voltage with the negative level electrical potential, and the gate electrode of the fifteenth TFT is coupled to the first node; wherein a source electrode of the sixteenth TFT is coupled to the second constant voltage with the negative level electrical potential, where a drain electrode of the sixteenth TFT is coupled to a source electrode of the seventeenth TFT, and a gate electrode of the sixteenth TFT is coupled to the first node; wherein a drain electrode of the seventeenth TFT is coupled to the drain electrode of the fourteenth TFT, where a gate electrode of the seventeenth TFT is coupled to either an input terminal of a constant voltage with a high electrical level or an input terminal of a clock signal in the current stage; wherein a gate electrode of the eighteenth TFT is coupled to the second node, a source electrode of the eighteenth TFT is coupled to the first constant voltage with the negative level electrical potential, and the drain electrode of the eighteenth TFT is coupled to the first node.

In one embodiment, one terminal of the bootstrap capacitor is coupled to the first node and the other terminal of the bootstrap capacitor is coupled to the output terminal of the scan driving signal in the current stage.

The GOA circuit of an IGZO thin film transistor and a display device thereof in the present invention adopts a first constant voltage with a negative level electrical potential VSS1 and a second constant voltage with a negative level electrical potential VSS2 in the GOA circuit, where the first constant voltage with a negative level electrical potential VSS1 is coupled to the pull-down holding unit 400 and the pull-down unit 500, and the second constant voltage with the negative level electrical potential VSS2 is coupled to the pull-down holding unit 400. The electrical potential levels outputted by the second constant voltage with the negative level electrical potential VSS2 and the first constant voltage with the negative level electrical potential VSS1 are less than a voltage threshold of the IGZO TFT to solve the problem of a negative threshold voltage of IGZO-TFT, resulting in the failure of the GOA circuit.

DETAILED DESCRIPTION OF THE PREFERRED EMBODIMENTS

Figure 1:
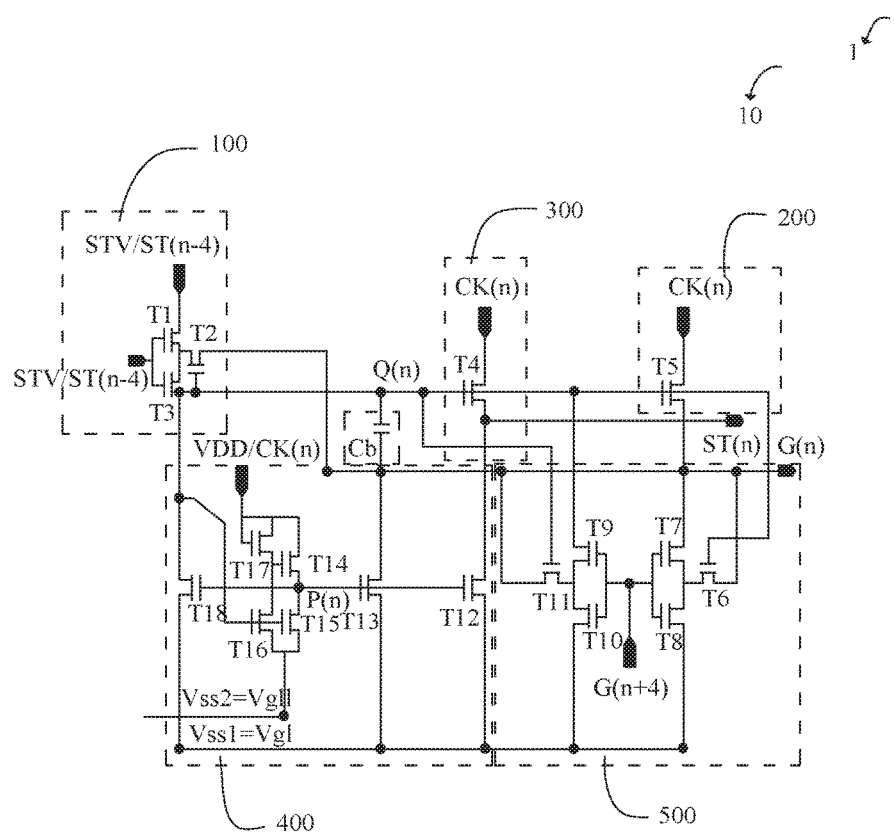
FIG. 1 is an illustrative overall structural view of a gate driver on array (GOA) circuit of an IGZO thin film transistor according to one embodiment of the present invention.

The following embodiments refer to the accompanying drawings for exemplifying specific implementable embodiments of the present invention. Furthermore, directional terms described by the present invention, such as upper, lower, front, back, left, right, inner, outer, side, etc., are only directions by referring to the accompanying drawings, and thus the used directional terms are used to describe and understand the present invention, but the present invention is not limited thereto. In the drawings, the same reference symbol represents the same or a similar component.

First Embodiment

The IGZO is the "Indium Gallium Zinc Oxide", which is a thin film transistor (TFT) technology by forming a metal oxide layer on an active layer of a TFT liquid crystal display (LCD). The IGZO material has properties of higher mobility rate and better device stability.

FIG. 1 is an illustrative overall structural view of a gate driver on array (GOA) circuit of an IGZO TFT according to one embodiment of the present invention. In FIG. 1, a GOA circuit 10 of the IGZO TFT of the present invention includes a plurality of cascade GOA units where N is a positive integer. The GOA unit in the stage N includes:

A pull-up control unit 100 is configured to control a scan driving signal of a scan line in a current stage to maintain a high level.

A pull-up unit 200 is configured to pull up the scan driving signal of the scan line in the current stage.

A pull-down unit 500 is configured to pull down the scan driving signal of the scan line in the current stage.

A pull-down holding unit 400 is configured to generate a scan driving signal having a low electrical level of the scan line in the current stage.

A transferring unit 300 is configured to output a stage-transmitting signal in the current stage.

A bootstrap capacitor Cb is configured to generate a scan driving signal having either a low or a high electrical level of the scan line in the current stage.

A first constant voltage with a negative level electrical potential VSS1 is configured to provide a first constant voltage signal with the negative level electrical potential, which is a negative direct current (DC) power.

A second constant voltage with a negative level electrical potential VSS2 is configured to provide a second constant voltage signal with the negative level electrical potential, which is a negative direct current (DC) power.

The first constant voltage with the negative level electrical potential VSS1 is coupled to the pull-down holding unit 400 and the pull-down unit 500. The second constant voltage with the negative level electrical potential VSS2 is coupled to the pull-down holding unit 400.

In one embodiment, an electrical potential level outputted by the second constant voltage with the negative level electrical potential VSS2 is less than an electrical potential level outputted by the first constant voltage with the negative level electrical potential VSS1.

In one embodiment, the electrical potential levels outputted by the second constant voltage with the negative level electrical potential VSS2 and the first constant voltage with the negative level electrical potential VSS1 are less than a voltage threshold of the IGZO TFT.

In one embodiment, the pull-up control unit 100 includes a first TFT T1, a second TFT T2, and a third TFT T3.

A source electrode of the first TFT T1 is coupled to either an input terminal ST(n−4) of a stage-transmitting signal in the stage (n−4) or an input terminal STV of a starting signal, where the drain electrode of the first TFT T1 is coupled to the source electrodes of the second TFT T2 and the third TFT T3, and a gate electrode of the first TFT T1 is coupled to a gate electrode of the third TFT T3.

A drain electrode of the second TFT T2 is coupled to an output terminal G(n) of the scan driving signal in the current stage, and a gate electrode of the second TFT T2 is coupled to a first node Q(n).

A drain electrode of the third TFT T3 is coupled to the first node Q(n), where a gate electrode of the third TFT T3 is coupled to either the input terminal ST(n−4) of a stage-transmitting signal in the stage (n−4) or the input terminal STV of the starting signal.

In one embodiment, the transferring unit 300 includes a fourth TFT T4, where a clock signal in the current stage is inputted to a source electrode of the fourth TFT T4. A drain electrode of the fourth TFT T4 is coupled to an output terminal ST(n) of a stage-transmitting signal in the current stage, and a gate electrode of the fourth TFT T4 is coupled to the first node Q(n).

In one embodiment, the pull-up unit 200 includes a fifth TFT T5, where a clock signal in the current stage is inputted to a source electrode of the fifth TFT T5. A drain electrode of the fifth TFT T5 is coupled to an output terminal G(n) of a scan driving signal in the current stage, and a gate electrode of the fifth TFT T5 is coupled to the first node Q(n).

In one embodiment, the pull-down unit 500 includes a sixth TFT T6, a seventh TFT T7, an eighth TFT T8, a ninth TFT T9, a tenth TFT T10, and an eleventh TFT T11.

A gate electrode of the sixth TFT T6 is coupled to the first node Q(n), where a drain electrode of the sixth TFT T6 is coupled to an output terminal G(n) of a scan driving signal in the current stage, and a source electrode of the sixth TFT T6 is coupled to a source electrode of the seventh TFT T7 and a drain electrode of the eighth TFT T8.

A drain electrode of the seventh TFT T7 is coupled to the output terminal G(n) of a scan driving signal in the current stage, where a source electrode of the seventh TFT T7 is coupled to a drain electrode of the eighth TFT T8, and a gate electrode of the seventh TFT 17 is coupled to a gate electrode of the eighth TFT T8.

A source electrode of the eighth TFT T8 is coupled to the first constant voltage with the negative level electrical potential VSS1, where a gate electrode of the eighth TFT T8 is coupled to an output terminal of a scan driving signal in the stage (n+4).

A drain electrode of the ninth TFT T9 is coupled to the first node Q(n), where a source electrode of the ninth TFT T9 is coupled to a drain electrode of the tenth TFT T10, and a gate electrode of the ninth TFT T9 is coupled to the gate electrode of third TFT T3.

A gate electrode of the tenth TFT T10 is coupled to the output terminal of the scan driving signal in the stage (n+4), where a source electrode of the tenth TFT T10 is coupled to the first constant voltage with a negative level electrical potential VSS1.

A gate electrode of the eleventh TFT T11 is coupled to the first node Q(n), where a drain electrode of the eleventh TFT T11 is coupled to an output terminal G(n) of a scan driving signal in the current stage, and a source electrode of the eleventh TFT T11 is coupled to the drain electrode of the tenth TFT T10.

In one embodiment, the pull-down holding unit 400 includes a twelfth TFT T12, a thirteenth TFT T13, a fourteenth TFT T14, a fifteenth TFT T15, a sixteenth TFT T16, a seventeenth TFT T117, and an eighteenth TFT T18.

A source electrode of the twelfth TFT T12 is coupled to the first constant voltage with the negative level electrical potential VSS1, where a drain electrode of the twelfth TFT T12 is coupled to an output terminal ST(n) of a stage-transmitting signal in the current stage, and a gate electrode of the twelfth TFT T12 is coupled to the second node P(n).

A source electrode of the thirteenth TFT T13 is coupled to the first constant voltage with the negative level electrical potential VSS1, where a drain electrode of the thirteenth TFT T13 is coupled to an output terminal ST(n) of a stage-transmitting signal in the current stage, and a gate electrode of the twelfth TFT T12 is coupled to the second node P(n).

A source electrode of the fourteenth TFT T14 is coupled to the second node P(n), where a drain electrode of the fourteenth TFT T14 is coupled to either an input terminal of a constant voltage with a high electrical level or an input terminal of a clock signal in the current stage, and a gate electrode of the fourteenth TFT T14 is coupled to a source electrode of the seventeenth TFT T17 and a drain electrode of the sixteenth TFT T16.

A drain electrode of the fifteenth TFT T15 is coupled to the second node P(n), where a source electrode of the fifteenth TFT T15 is coupled to the second constant voltage with the negative level electrical potential VSS2, and the gate electrode of the fifteenth TFT T15 is coupled to the first node Q(n).

A source electrode of the sixteenth TFT T16 is coupled to the second constant voltage with the negative level electrical potential VSS2, where a drain electrode of the sixteenth TFT T16 is coupled to a source electrode of the seventeenth TFT T17, and a gate electrode of the sixteenth TFT T16 is coupled to the first node Q(n).

A drain electrode of the seventeenth TFT T17 is coupled to the drain electrode of the fourteenth TFT T14, where a gate electrode of the seventeenth TFT T17 is coupled to either an input terminal of a constant voltage with a high electrical level or an input terminal of a clock signal in the current stage.

A gate electrode of the eighteenth TFT T18 is coupled to the second node P(n), where a source electrode of the eighteenth TFT T18 is coupled to the first constant voltage with the negative level electrical potential VSS1, and the drain electrode of the eighteenth TFT T18 is coupled to the first node Q(n).

In one embodiment, one terminal of the bootstrap capacitor Cb is coupled to the first node Q(n) and the other terminal of the bootstrap capacitor Cb is coupled to the output terminal G(n) of the scan driving signal in the current stage.

Figure 2:
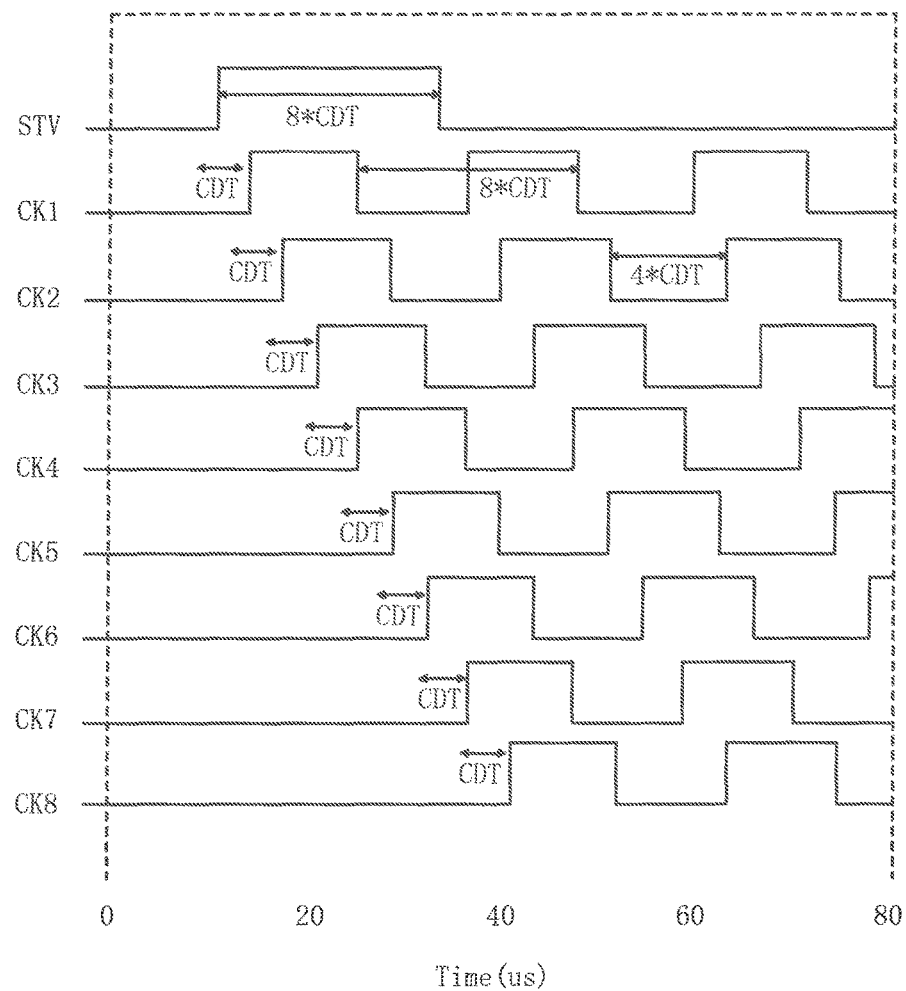
FIG. 2 is an illustrative relationship view of signal waveforms and electrical potentials of the GOA circuit of an IGZO thin film transistor according to one embodiment of the present invention.

FIG. 2 is an illustrative relationship view of signal waveforms and electrical potentials of the GOA circuit of an IGZO thin film transistor according to one embodiment of the present invention. For example, a display with 8K and 4K is described below. In one embodiment, the present invention adopts eight CK (i.e., clock signal) signals, where an overlapping time between CKs is defined as a CDT and an interval of the overlapping time is 3.75 μs. The STV is a trigger signal which is a start pulse, where each display frame is triggered by one STV and a pulse width of the STV is 8*CDT and an overlapping time between STV and CK is defined as a CDT.

The STV is a high frequency alternating current signal and appears one tome in each display frame. The CK is also a high frequency alternating current signal. The ST(n−4) is configured to connected to a previous stage-transmitting signal in the stage (n−4). For example, if the current stage is tenth stage, ST(n)=ST(10) and ST(n−4)=ST(6), where the first TFT T1 and second TFT T2 are connected to the STV in the stage (n−4).

The operation theorem of the present invention is described below.

Figure 3:
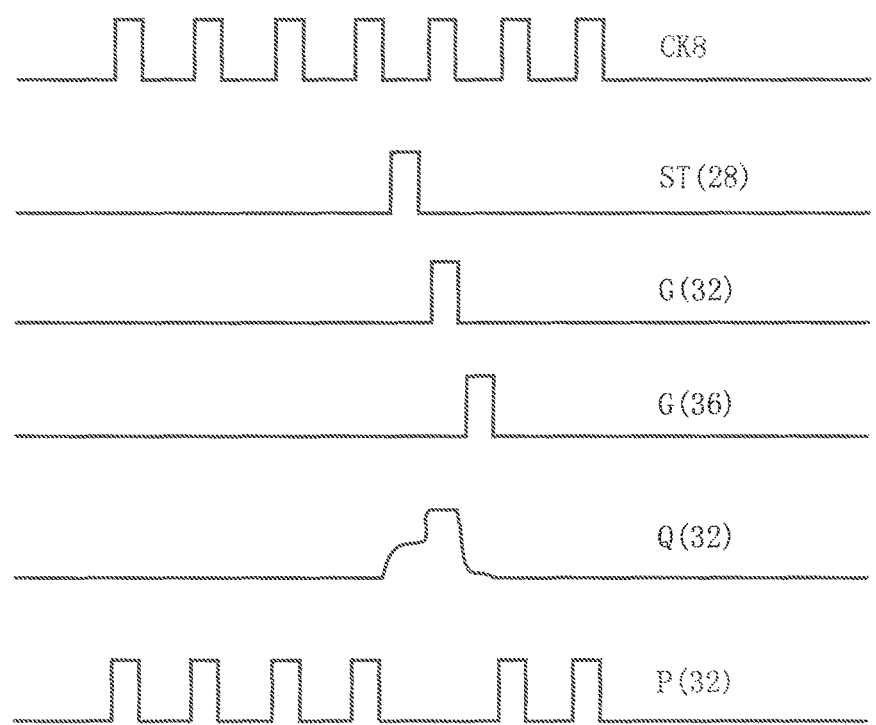
FIG. 3 is an illustrative waveform view of an operation theorem of the thirty-second stage of the GOA circuit in the IGZO thin film transistor according to one embodiment of the present invention.

FIG. 3 is an illustrative waveform view of an operation theorem of the thirty-second stage of the GOA circuit in the IGZO thin film transistor according to one embodiment of the present invention.

When G(n)=G(32), ST(n−4)=ST(28) and G(32) is controlled by CK8. When ST(28) is an high electrical level, the first TFT T1 and the third TFT T3 turn on and the high electrical level of ST(28) is inputted to the first node Q(32) where the first node Q(32) is a high electrical level. Meanwhile, the fifth TFT T5 turns on and CK8 is low electrical level so that G(32) is a low electrical level. Since the second P(32) is an low electrical level, the twelfth TFT T12, the thirteenth TFT T13, and the eighteenth TFT T18 turn off and the low electrical level of the first constant voltage with the negative level electrical potential VSS1 does not affect the electrical level of the first mode G(n).

Afterwards, when ST(28) is changed to low electrical level, the first TFT T1 and the third TFT T3 turn on. Meanwhile, CK8 is in a high electrical level so that G(32) outputs a high electrical level. The first node Q(32) pulls up to a higher electrical level due to a coupling effect of a capacitor and the second node (32) maintains a low electrical level continuously.

It should be noted that the first TFT T1, if the threshold voltage of the second TFT T2, the third TFT T3, the ninth TFT T9, the tenth TFT T10 and the tenth TFT T10 in a conventional GOA circuit downgrades to a negative value, the high electrical level of the first node Q(32) leaks so that the fifth TFT T5 turns off and the high electrical level CK cannot be inputted to the G(32), resulting in the failure of G(32). The threshold voltage of the sixth TFT T6, the seventh TFT T7 and the eighth TFT T8 downgrades to a negative value the high electrical level of the first node Q(32) leaks so that the high electrical level of the G(32) is pulled down and thus the G(32) cannot normally output a waveform signal. In the present invention, the first TFT T1, the second TFT T2 and the third TFT T3 of the pull-up control unit 100 adopt a structure type of three-transistor. The sixth TFT T6, the seventh TFT T7, the eighth TFT T8, the ninth TFT T9, the tenth TFT T10, and the eleventh TFT T11 of the pull-down unit 500 also adopt a structure type of three-transistor. During an operation time interval, the breakdown voltage of the first TFT T1, the second TFT T2, the third TFT T3, the ninth TFT T9, the tenth TFT T10, and the eleventh TFT T11 is less than zero so that the IGZO TFT can prevent an excessive negative status of the threshold voltage to normally output a waveform signal from the G(32).

Afterwards, when G(36) is a high electrical level, the TFT T7, the eighth TFT T8, the ninth TFT T9, and the tenth TFT T10 turn on, the first node Q(32) and G(32) are pulled down a low electrical level. Since the second node P(32) is in a high electrical level, the ninth TFT T9, the tenth TFT T10, the eleventh TFT T11, the twelfth TFT T12, the thirteenth TFT T13, and the eighteenth TFT T18 turn on so that the first node Q(32) and G(32) maintains a low electrical level.

Moreover, the pull-down holding unit 400 adopts the CK(n) to replace the direct current VDD to prevent the fourteenth TFT T14 and the seventeenth TFT T17 from the positive bias temperature stress (PBTS) which leads to a severe positive migration of the threshold voltage of the IGZO-TFT and thus results in the failure of the GOA circuit.

The GOA circuit 10 of an IGZO thin film transistor and a display device 1 thereof in the present invention adopts a first constant voltage with a negative level electrical potential VSS1 and a second constant voltage with a negative level electrical potential VSS2 in the GOA circuit 10, where the first constant voltage with a negative level electrical potential VSS1 is coupled to the pull-down holding unit 400 and the pull-down unit 500, and the second constant voltage with the negative level electrical potential VSS2 is coupled to the pull-down holding unit 400. The electrical potential levels outputted by the second constant voltage with the negative level electrical potential VSS2 and the first constant voltage with the negative level electrical potential VSS1 are less than a voltage threshold of the IGZO TFT to solve the problem of a negative threshold voltage of IGZO-TFT, resulting in the failure of the GOA circuit 10.

Second Embodiment

The present invention provides a display device 1 including a gate driver on array (GOA) circuit of an IGZO TFT in the first embodiment, where the GOA circuit 10 of the IGZO TFT as described in the above-mentioned disclosure will not be repeated here.

As is understood by a person skilled in the art, the foregoing preferred embodiments of the present invention are illustrative rather than limiting of the present invention. It is intended that they cover various modifications and similar arrangements be included within the spirit and scope of the present invention, the scope of which should be accorded the broadest interpretation so as to encompass all such modifications and similar structures.

What is claimed is:

1. A gate driver on array (GOA) circuit of an indium gallium zinc oxide (IGZO) in a thin film transistor (TFT) comprising a plurality of cascade GOA units wherein n is a positive integer, the GOA unit in the stage N comprising:
    a pull-up control unit configured to control a scan driving signal of a scan line in a current stage to maintain a high level;
    a pull-up unit configured to pull up the scan driving signal of the scan line in the current stage;
    a pull-down unit configured to pull down the scan driving signal of the scan line in the current stage;
    a pull-down holding unit configured to generate a scan driving signal having a low electrical level of the scan line in the current stage;
    a transferring unit configured to output a stage-transmitting signal in the current stage;
    a bootstrap capacitor configured to generate a scan driving signal having a low or a high electrical level of the scan line in the current stage;
    a first constant voltage with a negative level electrical potential configured to provide a first constant voltage signal with the negative level electrical potential, which is a negative direct current (DC) power; and
    a second constant voltage with a negative level electrical potential configured to provide a second constant voltage signal with the negative level electrical potential, which is a negative direct current (DC) power;
    wherein the first constant voltage with the negative level electrical potential is coupled to the pull-down holding unit and the pull-down unit, and the second constant voltage with the negative level electrical potential is coupled to the pull-down holding unit;
    wherein the pull-up control unit comprises a first TFT, a second TFT, and a third TFT;
    wherein a source electrode of the first TFT is coupled to an input terminal ST(n−4) of a stage-transmitting signal in a stage (n−4) or an input terminal STV of a starting signal, a drain electrode of the first TFT is coupled to source electrodes of the second TFT and the third TFT, and a gate electrode of the first TFT is coupled to a gate electrode of the third TFT;
    wherein a drain electrode of the second TFT is coupled to an output terminal of the scan driving signal in the current stage, and a gate electrode of the second TFT is coupled to a first node;
    wherein a drain electrode of the third TFT is coupled to the first node, a gate electrode of the third TFT is coupled to the input terminal ST(n−4) of the stage-transmitting signal in the stage (n−4) or the input terminal of the starting signal.

2. The GOA circuit of the IGZO in the TFT of claim 1, wherein an electrical potential level outputted by the second constant voltage with the negative level electrical potential is less than an electrical potential level outputted by the first constant voltage with the negative level electrical potential.

3. The GOA circuit of the IGZO in the TFT of claim 1, wherein electrical potential levels outputted by the second constant voltage with the negative level electrical potential and the first constant voltage with the negative level electrical potential are less than a voltage threshold of the IGZO in the TFT.

4. The GOA circuit of the IGZO in the TFT of claim 1, wherein the transferring unit comprises a fourth TFT, a clock signal in the current stage is inputted to a source electrode of the fourth TFT, a drain electrode of the fourth TFT is coupled to an output terminal of a stage-transmitting signal in the current stage, and a gate electrode of the fourth TFT is coupled to the first node.

5. The GOA circuit of the IGZO in the TFT of claim 1, wherein the pull-up unit comprises a fifth TFT, a clock signal in the current stage is inputted to a source electrode of the fifth TFT, a drain electrode of the fifth TFT is coupled to an output terminal of a scan driving signal in the current stage, and a gate electrode of the fifth TFT is coupled to the first node.

6. The GOA circuit of the IGZO in the TFT of claim 1, wherein the pull-down unit comprises a sixth TFT, a seventh TFT, an eighth TFT, a ninth TFT, a tenth TFT, and an eleventh TFT;
    wherein a gate electrode of the sixth TFT is coupled to the first node, a drain electrode of the sixth TFT is coupled to an output terminal of a scan driving signal in the current stage, and a source electrode of the sixth TFT is coupled to a source electrode of the seventh TFT and a drain electrode of the eighth TFT;
    wherein a drain electrode of the seventh TFT is coupled to the output terminal of a scan driving signal in the current stage, a source electrode of the seventh TFT is coupled to a drain electrode of the eighth TFT, and a gate electrode of the seventh TFT is coupled to a gate electrode of the eighth TFT;
    wherein a source electrode of the eighth TFT is coupled to the first constant voltage with the negative level electrical potential, a gate electrode of the eighth TFT is coupled to an output terminal of a scan driving signal in the stage (n+4);
    wherein a drain electrode of the ninth TFT is coupled to the first node, where a source electrode of the ninth TFT is coupled to a drain electrode of the tenth TFT, and a gate electrode of the ninth TFT is coupled to the gate electrode of third TFT;
    wherein a gate electrode of the tenth TFT is coupled to the output terminal of the scan driving signal in the stage (n+4), where a source electrode of the tenth TFT is coupled to the first constant voltage with a negative level electrical potential;
    wherein a gate electrode of the eleventh TFT is coupled to the first node, a drain electrode of the eleventh TFT is coupled to an output terminal of a scan driving signal in the current stage, and a source electrode of the eleventh TFT is coupled to the drain electrode of the tenth TFT.

7. The GOA circuit of the IGZO in the TFT of claim 1, wherein the pull-down holding unit comprises a twelfth TFT, a thirteenth TFT, a fourteenth TFT, a fifteenth TFT, a sixteenth TFT, a seventeenth TFT, and an eighteenth TFT;

wherein a source electrode of the twelfth TFT is coupled to the first constant voltage with the negative level electrical potential, a drain electrode of the twelfth TFT is coupled to an output terminal of a stage-transmitting signal in the current stage, and a gate electrode of the twelfth TFT is coupled to the second node;

wherein a source electrode of the thirteenth TFT is coupled to the first constant voltage with the negative level electrical potential, a drain electrode of the thirteenth TFT is coupled to an output terminal of a stage-transmitting signal in the current stage, and a gate electrode of the twelfth TFT is coupled to the second node;

wherein a source electrode of the fourteenth TFT is coupled to the second node, a drain electrode of the fourteenth TFT is coupled to an input terminal of a constant voltage with a high electrical level or an input terminal of a clock signal in the current stage, and a gate electrode of the fourteenth TFT is coupled to a source electrode of the seventeenth TFT and a drain electrode of the sixteenth TFT;

wherein a drain electrode of the fifteenth TFT is coupled to the second node, a source electrode of the fifteenth TFT is coupled to the second constant voltage with the negative level electrical potential, and the gate electrode of the fifteenth TFT is coupled to the first node;

wherein a source electrode of the sixteenth TFT is coupled to the second constant voltage with the negative level electrical potential, where a drain electrode of the sixteenth TFT is coupled to a source electrode of the seventeenth TFT, and a gate electrode of the sixteenth TFT is coupled to the first node;

wherein a drain electrode of the seventeenth TFT is coupled to the drain electrode of the fourteenth TFT, where a gate electrode of the seventeenth TFT is coupled to an input terminal of a constant voltage with a high electrical level or an input terminal of a clock signal in the current stage;

wherein a gate electrode of the eighteenth TFT is coupled to the second node, a source electrode of the eighteenth TFT is coupled to the first constant voltage with the negative level electrical potential, and the drain electrode of the eighteenth TFT is coupled to the first node.

8. The GOA circuit of the IGZO in the TFT of claim 1, wherein one terminal of the bootstrap capacitor is coupled to the first node and the other terminal of the bootstrap capacitor is coupled to the output terminal of the scan driving signal in the current stage.

9. A display device comprising a gate driver on array (GOA) circuit of an indium gallium zinc oxide (IGZO) in a thin film transistor (TFT), the GOA circuit comprising:

a plurality of cascade GOA units wherein n is a positive integer, the GOA unit in the stage N comprising:

a pull-up control unit configured to control a scan driving signal of a scan line in a current stage to maintain a high level;

a pull-up unit configured to pull up the scan driving signal of the scan line in the current stage;

a pull-down unit configured to pull down the scan driving signal of the scan line in the current stage;

a pull-down holding unit configured to generate a scan driving signal having a low electrical level of the scan line in the current stage;

a transferring unit configured to output a stage-transmitting signal in the current stage;

a bootstrap capacitor configured to generate a scan driving signal having a low or a high electrical level of the scan line in the current stage;

a first constant voltage with a negative level electrical potential configured to provide a first constant voltage signal with the negative level electrical potential, which is a negative direct current (DC) power; and a second constant voltage with a negative level electrical potential configured to provide a second constant voltage signal with the negative level electrical potential, which is a negative direct current (DC) power;

wherein the first constant voltage with the negative level electrical potential is coupled to the pull-down holding unit and the pull-down unit, and the second constant voltage with the negative level electrical potential is coupled to the pull-down holding unit;

wherein the pull-up control unit comprises a first TFT, a second TFT, and a third TFT;

wherein a source electrode of the first TFT is coupled to an input terminal ST(n−4) of a stage-transmitting signal in a stage (n−4) or an input terminal STV of a starting signal, a drain electrode of the first TFT is coupled to source electrodes of the second TFT and the third TFT, and a gate electrode of the first TFT is coupled to a gate electrode of the third TFT;

wherein a drain electrode of the second TFT is coupled to an output terminal of the scan driving signal in the current stage, and a gate electrode of the second TFT is coupled to a first node;

wherein a drain electrode of the third TFT is coupled to the first node, a gate electrode of the third TFT is coupled to the input terminal ST(n−4) of the stage-transmitting signal in the stage (n−4) or the input terminal of the starting signal.

10. The display device of claim 9, wherein an electrical potential level outputted by the second constant voltage with the negative level electrical potential is less than an electrical potential level outputted by the first constant voltage with the negative level electrical potential.

11. The display device of claim 9, wherein electrical potential levels outputted by the second constant voltage with the negative level electrical potential and the first constant voltage with the negative level electrical potential are less than a voltage threshold of the IGZO in the TFT.

12. The display device of claim 9, wherein the transferring unit comprises a fourth TFT, a clock signal in the current stage is inputted to a source electrode of the fourth TFT, a drain electrode of the fourth TFT is coupled to an output terminal of a stage-transmitting signal in the current stage, and a gate electrode of the fourth TFT is coupled to the first node.

13. The display device of claim 9, wherein the pull-up unit comprises a fifth TFT, a clock signal in the current stage is inputted to a source electrode of the fifth TFT, a drain electrode of the fifth TFT is coupled to an output terminal of a scan driving signal in the current stage, and a gate electrode of the fifth TFT is coupled to the first node.

14. The display device of claim 9, wherein the pull-down unit comprises a sixth TFT, a seventh TFT, an eighth TFT, a ninth TFT, a tenth TFT, and an eleventh TFT;

wherein a gate electrode of the sixth TFT is coupled to the first node, a drain electrode of the sixth TFT is coupled to an output terminal of a scan driving signal in the current stage, and a source electrode of the sixth TFT is coupled to a source electrode of the seventh TFT and a drain electrode of the eighth TFT;

wherein a drain electrode of the seventh TFT is coupled to the output terminal of a scan driving signal in the current stage, a source electrode of the seventh TFT is coupled to a drain electrode of the eighth TFT, and a gate electrode of the seventh TFT is coupled to a gate electrode of the eighth TFT;

wherein a source electrode of the eighth TFT is coupled to the first constant voltage with the negative level electrical potential, a gate electrode of the eighth TFT is coupled to an output terminal of a scan driving signal in the stage (n+4);

wherein a drain electrode of the ninth TFT is coupled to the first node, where a source electrode of the ninth TFT is coupled to a drain electrode of the tenth TFT, and a gate electrode of the ninth TFT is coupled to the gate electrode of third TFT;

wherein a gate electrode of the tenth TFT is coupled to the output terminal of the scan driving signal in the stage (n+4), where a source electrode of the tenth TFT is coupled to the first constant voltage with a negative level electrical potential;

wherein a gate electrode of the eleventh TFT is coupled to the first node, a drain electrode of the eleventh TFT is coupled to an output terminal of a scan driving signal in the current stage, and a source electrode of the eleventh TFT is coupled to the drain electrode of the tenth TFT.

15. The display device of claim 9, wherein the pull-down holding unit comprises a twelfth TFT, a thirteenth TFT, a fourteenth TFT, a fifteenth TFT, a sixteenth TFT, a seventeenth TFT, and an eighteenth TFT;

wherein a source electrode of the twelfth TFT is coupled to the first constant voltage with the negative level electrical potential, a drain electrode of the twelfth TFT is coupled to an output terminal of a stage-transmitting signal in the current stage, and a gate electrode of the twelfth TFT is coupled to the second node;

wherein a source electrode of the thirteenth TFT is coupled to the first constant voltage with the negative level electrical potential, a drain electrode of the thirteenth TFT is coupled to an output terminal of a stage-transmitting signal in the current stage, and a gate electrode of the twelfth TFT is coupled to the second node;

wherein a source electrode of the fourteenth TFT is coupled to the second node, a drain electrode of the fourteenth TFT is coupled to an input terminal of a constant voltage with a high electrical level or an input terminal of a clock signal in the current stage, and a gate electrode of the fourteenth TFT is coupled to a source electrode of the seventeenth TFT and a drain electrode of the sixteenth TFT;

wherein a drain electrode of the fifteenth TFT is coupled to the second node, a source electrode of the fifteenth TFT is coupled to the second constant voltage with the negative level electrical potential, and the gate electrode of the fifteenth TFT is coupled to the first node;

wherein a source electrode of the sixteenth TFT is coupled to the second constant voltage with the negative level electrical potential, where a drain electrode of the sixteenth TFT is coupled to a source electrode of the seventeenth TFT, and a gate electrode of the sixteenth TFT is coupled to the first node;

wherein a drain electrode of the seventeenth TFT is coupled to the drain electrode of the fourteenth TFT, where a gate electrode of the seventeenth TFT is coupled to an input terminal of a constant voltage with a high electrical level or an input terminal of a clock signal in the current stage;

wherein a gate electrode of the eighteenth TFT is coupled to the second node, a source electrode of the eighteenth TFT is coupled to the first constant voltage with the negative level electrical potential, and the drain electrode of the eighteenth TFT is coupled to the first node.

16. The display device of claim 9, wherein one terminal of the bootstrap capacitor is coupled to the first node and the other terminal of the bootstrap capacitor is coupled to the output terminal of the scan driving signal in the current stage.

* * * * *